United States Patent
Sutardja et al.

(10) Patent No.: US 9,007,130 B2
(45) Date of Patent: Apr. 14, 2015

(54) SYSTEMS AND METHODS FOR BOOSTING A RECEIVED AC SIGNAL USING A POWER AMPLIFIER INCLUDING PHASE CONDITIONERS

(71) Applicant: Marvell World Trade Ltd., St. Michael (BB)

(72) Inventors: Sehat Sutardja, Los Altos Hills, CA (US); Poh Boon Leong, Singapore (SG); Ping Song, Singapore (SG); Nuntha Kumar Krishnasamy Maniam, Singapore (SG)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/154,499

(22) Filed: Jan. 14, 2014

(65) Prior Publication Data

US 2014/0125417 A1 May 8, 2014

Related U.S. Application Data

(63) Continuation of application No. 13/336,817, filed on Dec. 23, 2011, now Pat. No. 8,629,727.

(60) Provisional application No. 61/426,986, filed on Dec. 23, 2010.

(51) Int. Cl.
*H03F 3/21* (2006.01)
*H03F 1/22* (2006.01)
*H03F 3/193* (2006.01)
*H03F 3/24* (2006.01)
*H03F 3/45* (2006.01)

(52) U.S. Cl.
CPC ............... *H03F 3/211* (2013.01); *H03F 1/223* (2013.01); *H03F 3/193* (2013.01); *H03F 3/245* (2013.01); *H03F 3/45179* (2013.01); *H03F 3/45188* (2013.01); *H03F 2200/408* (2013.01); *H03F 2200/534* (2013.01); *H03F 2200/537* (2013.01); *H03F 2200/541* (2013.01); *H03F 2203/45544* (2013.01); *H03F 2203/45562* (2013.01); *H03F 2203/45566* (2013.01); *H03F 2203/45621* (2013.01); *H03F 2203/45644* (2013.01); *H03F 2203/45731* (2013.01)

(58) Field of Classification Search
USPC .......................... 330/296, 310, 305, 252–261
See application file for complete search history.

(56) References Cited

U.S. PATENT DOCUMENTS

| | | |
|---|---|---|
| 2,961,615 A | 11/1960 | Barton |
| 3,030,585 A | 4/1962 | Marvin et al. |
| 3,657,579 A | 4/1972 | Kramer |

(Continued)

OTHER PUBLICATIONS

International Search Report and Written Opinion from International Application No. PCT/US2011/67233 filed Dec. 23, 2011.

*Primary Examiner* — Hieu Nguyen

(57) ABSTRACT

A power amplifier configured to boost an AC signal. The power amplifier includes a first transistor, a second transistor, a first inductor connected between the first transistor and a voltage source, and a second inductor connected between the second transistor and ground. A first phase conditioner arranged at an input of the first transistor is configured to condition a phase of the AC signal such that the AC signal as received by the first transistor is out of phase with respect to the AC signal as received by the first inductor. A second phase conditioner arranged at an input of the second transistor is configured to condition a phase of the AC signal such that the AC signal as received by the second transistor is out of phase with respect to the AC signal as received by the second inductor.

16 Claims, 8 Drawing Sheets

(56) References Cited

U.S. PATENT DOCUMENTS

| | | |
|---|---|---|
| 8,229,367 B2 | 7/2012 | Chan et al. |
| 8,346,179 B2 * | 1/2013 | Brunn et al. .................. 455/73 |
| 2002/0149425 A1 | 10/2002 | Chawla et al. |
| 2010/0148877 A1 | 6/2010 | Oakley et al. |

* cited by examiner

SYSTEMS AND METHODS FOR BOOSTING A RECEIVED AC SIGNAL USING A POWER AMPLIFIER INCLUDING PHASE CONDITIONERS

CROSS-REFERENCE TO RELATED APPLICATIONS

The present disclosure is a continuation of U.S. patent application Ser. No. 13/336,817 (now U.S. Pat. No. 8,629,727), filed on Dec. 23, 2011, which claims the benefit of U.S. Provisional Application No. 61/426,986, filed on Dec. 23, 2010. The entire disclosures of the applications referenced above are incorporated herein by reference.

BACKGROUND

Embodiments of the present invention generally relate to power amplifiers, and more particularly relate to power amplifiers having improved power amplification.

Unless otherwise indicated herein, the approaches described in the background section are not prior art to the claims in this application and are not admitted to be prior art by inclusion in the background section.

Power amplifiers are generally configured to receive an AC signal, such as an RF signal, and boost the power of the AC signal. Traditional power amplifiers often include a single nMOS transistor or a cascade with tank loading. FIG. 1 is a simplified schematic of a traditional power amplifier 100 that includes an nMOS transistor 105 coupled between an inductor 110 and ground. Inductor 110 may be coupled to a voltage source Vdd. Inductor 110 may also be coupled to a capacitor 115 in a tank configuration for tuning the resonance of power amplifier 100. NMOS transistor 105 may be in a common source configuration with the gate of nMOS transistor 105 configured to operate as an input AC In to receive an AC signal and a drain coupled to the output Vout of power amplifier 100. FIG. 2 is a simplified schematic of another traditional power amplifier 200 that includes first and second nMOS transistors 205 and 210 in series between an inductor 215 and ground. Inductor 215 may be coupled to a voltage source Vdd. Inductor 215 may also be coupled to a capacitor 220 in a tank configuration for tuning the resonance of power amplifier 200. The nMOS transistors 205 and 210 may be in a common source, common gate configuration (i.e., a cascode configuration) with the gate of nMOS transistor 205 configured to operate as an input AC In to receive an AC signal and a drain of transistor 210 coupled to the output Vout of power amplifier 200.

In traditional power amplifiers, such as power amplifiers 100 and 200 described above, the typical maximum voltage at the output Vout is 2Vdd and the typical maximum power output is about (2Vdd)2/R where R is a load resistance of the power amplifiers. While the power output of traditional power amplifiers, such as power amplifiers 100 and 200, is acceptable for a number of amplification, it would be desirable to provide new power amplifiers that provide higher power output than the power output of traditional power amplifiers.

SUMMARY

Embodiments of the present invention generally relate to power amplifiers, and more particularly relate to power amplifiers having improved power amplification.

According to one embodiment of the present invention, a power amplifier includes a first transistor, and a first inductor disposed between the first transistor and a voltage source. A first node between the first transistor and the first inductor is a first output node. The power amplifier further includes a second inductor disposed between the first transistor and ground, a third inductor coupled to a gate of the first transistor and configured as a first AC input. The power amplifier further includes a first phase conditioner inductively coupled to the second inductor and the third inductor and configured to set phases of AC signals across the first inductor and the second inductor in phase. The power amplifier further includes a second transistor, and a fourth inductor disposed between the second transistor and a ground. A second node between the fourth transistor and the second inductor is a second output node. The power amplifier further includes a fifth inductor disposed between the second transistor and the voltage source, and a sixth inductor coupled to a gate of the second transistor and configured as a second AC input. The power amplifier further includes a second phase conditioner inductively coupled to the fifth inductor and the sixth inductor and configured to set phases of AC signals across the fourth inductor and the fifth inductor in phase.

According to one specific embodiment, the first phase conditioner includes: a first amplifier configured to receive a prior-stage AC signal, a first transformer inductor inductively coupled to the third inductor, and a second transformer inductor inductively coupled to the second inductor. The second phase conditioner includes: a second amplifier configured to receive the prior-stage AC signal, a third transformer inductor inductively coupled to the fifth inductor; and a fourth transformer inductor inductively coupled to the sixth inductor.

According to another specific embodiment, a first end of the first transformer inductor is coupled to an output of the first amplifier, a second end of the first transformer inductor is coupled to a first end of the second transformer inductor, and a second end of the second transformer inductor is coupled to the ground.

According to another specific embodiment, a first end of the third transformer inductor is coupled to an output of the second amplifier, a second end of the third transformer inductor is coupled to a first end of the fourth transformer inductor, and a second end of the fourth transformer inductor is coupled to the voltage source.

According to another specific embodiment, the first phase conditioner further includes a first capacitor in parallel with the first transformer inductor, and a second capacitor in parallel with the second transformer inductor.

According to another specific embodiment, the second phase conditioner further includes a third capacitor in parallel with the third transformer inductor, and a fourth capacitor in parallel with the fourth transformer inductor.

According to another specific embodiment, the first output node and the second output node are coupled by a capacitor.

According to another specific embodiment, the power amplifier further includes a first capacitor in parallel with the first inductor, and a second capacitor in parallel with the fourth inductor.

According to another specific embodiment, the power amplifier further includes a third transistor disposed between the first transistor and the first inductor; and a fourth transistor disposed between the second transistor and the fourth inductor.

According to another specific embodiment, the first and the third transistors are in a cascode configuration, and the second and fourth transistors are in a cascode configuration.

According to another specific embodiment, the first and the third transistors are nMOS transistors, and the second and the fourth transistors are pMOS transistors.

According to another embodiment, a power amplifier includes a first transistor, and a first inductor disposed between the first transistor and a voltage source. A first node between the first transistor and the first inductor is a first output node. The power amplifier further includes a second inductor disposed between the first transistor and ground. The power amplifier further includes a third inductor coupled to a gate of the first transistor and inductively coupled to the second inductor to form a first transformer. The power amplifier further includes a first phase conditioner coupled in series with the first transformer and configured as a first AC input. The power amplifier further includes a second transistor, and a fourth inductor disposed between the second transistor and ground. A second node between the second transistor and the second inductor is a second output node. The power amplifier further includes a fifth inductor disposed between the first transistor and the voltage source. The power amplifier further includes a sixth inductor coupled to a gate of the second transistor and inductively coupled to the fifth inductor to form a second transformer. The power amplifier further includes a second phase conditioner coupled in series with the second transformer and configured as a second AC input. The first transformer and the first phase conditioner are configured to set phases of AC signals across the first inductor and the second inductors in phase. The second transformer and the second phase conditioner are configured to set phases of AC signals across the fourth inductor and the fifth inductors in phase.

According to a specific embodiment, the first phase conditioner includes a first amplifier configured to receive a prior-stage AC signal, and a first transformer inductor coupled to an output of the first amplifier. The first phase conditioner further includes a second transformer inductor inductively coupled to the first transformer inductor and coupled in series to the third inductor. The second transformer inductor is configured as the first AC input. The second phase conditioner includes a second amplifier configured to receive the prior-stage AC signal, and a third transformer inductor coupled to an output of the second amplifier. The second phase conditioner further includes a fourth transformer inductor inductively coupled to the third transformer inductor and coupled in series to the sixth inductor. The fourth transformer inductor is configured as the second AC input.

According to another specific embodiment, the first transformer inductor is coupled to the ground, and the third transformer inductor transformer is coupled to the ground.

According to another specific embodiment, the power amplifier further includes a third transistor disposed in series between the first transistor and the first inductor, and a fourth transistor disposed in series between the second transistor and the fourth inductor.

According to another specific embodiment, the first output node is between the third transistor and the first inductor, and the second output node is between the fourth transistor and the fourth inductor.

According to another specific embodiment, the first and the third transistors are in a cascode configuration, and the second and fourth transistors are in a cascode configuration.

According to another specific embodiment, the first and the third transistors are nMOS transistors, and the second and the fourth transistors are pMOS transistors.

The following detailed description and accompanying drawings provide a more detailed understanding of the nature and advantages of the present invention.

DESCRIPTION

Embodiments of the present invention generally provide a power amplifier, and more particularly provide a power amplifier having improved power amplification.

In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Power amplifiers are generally configured to receive an AC signal, such as an RF signal, and boost the power of the received AC signal. Power amplifiers may be included in a variety of mobile devices, such as mobile telephones, computers (such as laptop computers, tablet computers, etc.), personal digital assistants, and the like. A power-amplified AC signal may be directed through an antenna of a mobile device for transmission.

Figure 1:
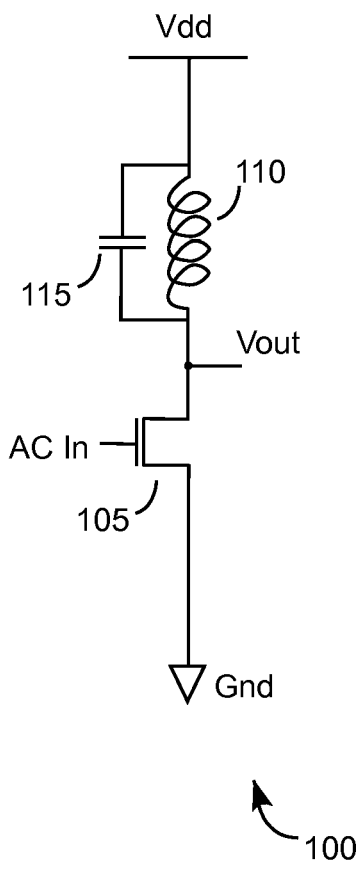
FIG. 1 is a simplified schematic of a traditional power amplifier that includes an nMOS transistor coupled between an inductor and ground.
Figure 2:
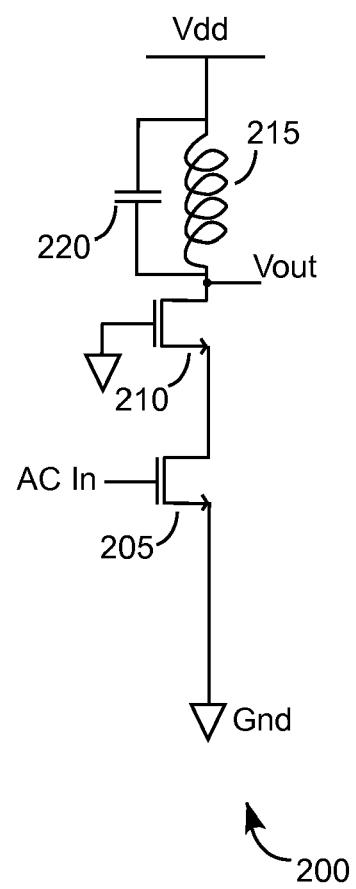
FIG. 2 is a simplified schematic of another traditional power amplifier that may include first and second nMOS transistors and in series between an inductor and ground.
Figure 3A:
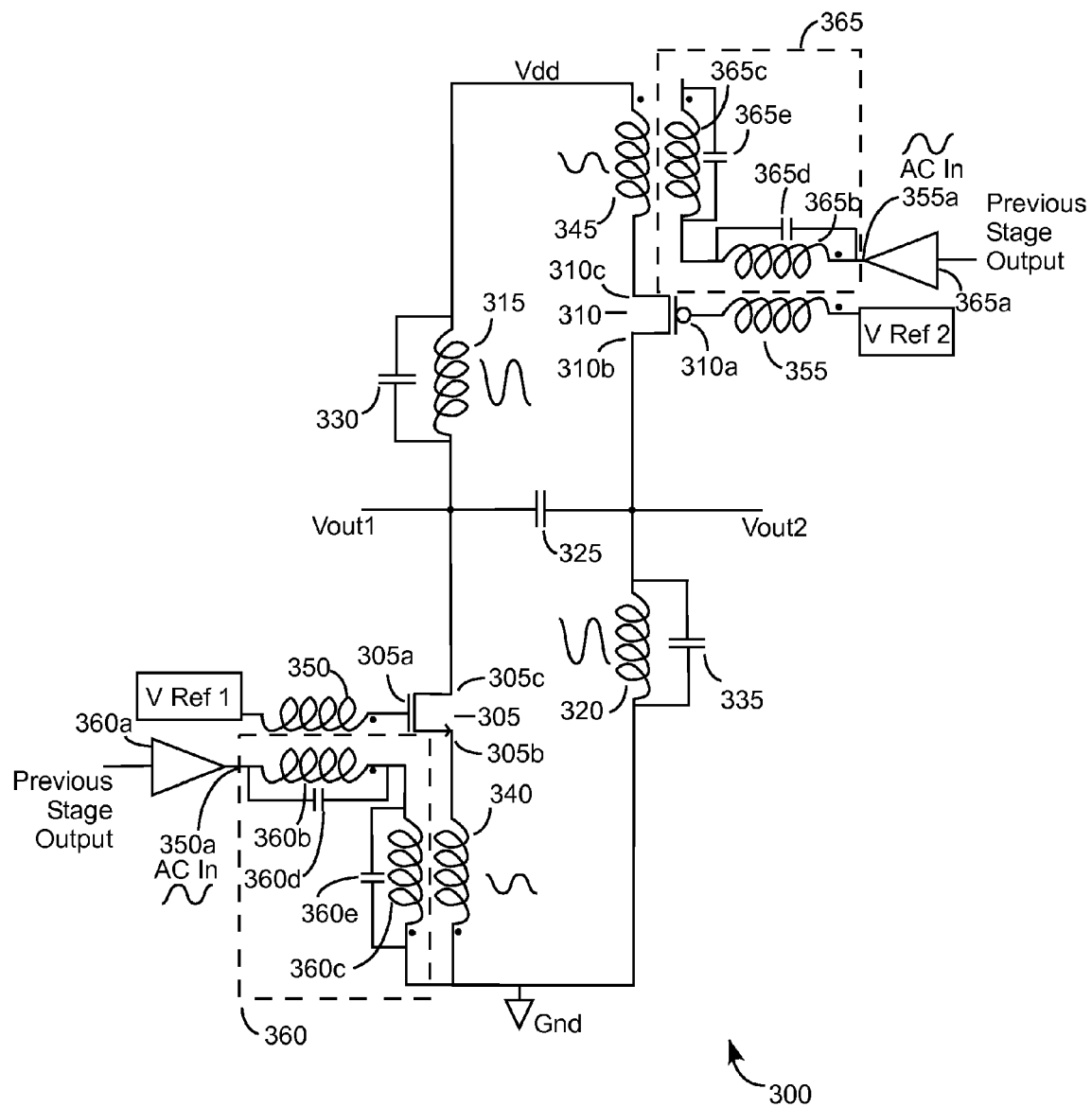
FIG. 3A is a simplified schematic of a power amplifier according to one embodiment.

FIG. 3A is a simplified schematic of a power amplifier 300 according to one embodiment of the present invention. Power amplifier 300 includes a push-pull pair of transistors 305 and 310, (referred to as transistors 305 and 310). Power amplifier 300 further includes first and second inductors 315 and 320 and a capacitor 325. Power amplifier 300 may also include first and second tank capacitors 330 and 335. Capacitor 330 is coupled to inductor 315 in parallel (i.e., in a "tank" configuration). Tank capacitor 330 is configured to tune the resonant frequency of inductor 315. Tank capacitor 335 is coupled to inductor 320 in a tank configuration. Tank capacitor 335 is configured to tune the resonant frequency of inductor 320.

Transistors 305 and 310 may be metal-oxide-semiconductor field-effect transistors (MOSFETs), bipolar-junction transistors (BJTs), or other transistors types. For convenience, power amplifier embodiments are described herein as including MOSFETs. While power amplifier embodiments are described herein as including MOSFETs, it will be understood by those of skill in the art that BJTs or other types of transistors may be appropriately substituted for the MOSFETs and these power amplifier embodiments that include BJTs or the like are considered to be within the scope and purview of the power amplifier embodiments of the present invention.

According to one embodiment, transistor 305 is an nMOS transistor with a drain 305c (sometimes referred to a drain region) coupled to a first end of inductor 315 where a second end of inductor 315 is coupled to a voltage source Vdd. A first output Vout1 is disposed between drain 305c and the first end of inductor 315. A source 305b of transistor 305 may be coupled to a first end of the third inductor 340 where a second end of the third inductor 340 is coupled to ground. Specific configurations of the sources and the drains of transistors 305 and 310 are described herein for convenience of explanation of specific embodiments. Alternative embodiments of the power amplifiers may include alternative configurations of the sources and drains of transistors 305 and 310 as will be understood by those of skill in the art.

According to one embodiment, transistor 310 is a pMOS transistor with a drain 310b coupled a first end of inductor 320 where a second end of inductor 320 is coupled to ground. A second output Vout2 is disposed between drain 310b and the first end of inductor 320. A source 310c of transistor 310 is coupled a first end of fourth inductor 345 where a second end of inductor 345 is coupled to the voltage source Vdd. Inductors 315 and 320 may be considered the respective loads of the push-pull pair of transistors 305 and 310.

According to one embodiment, power amplifier 300 includes first and second input inductors 350 and 355. A first end of first input inductor 350 is coupled to a gate 305a of transistor 305 and a second end of first input inductor 350 may be coupled to a first reference voltage (labeled V Ref 1 in FIG. 3A), which may be a DC reference voltage. The reference voltage is sometimes referred to as a bias voltage. A first end of second input inductor 355 is coupled to a gate 310a of transistor 310 and a second end of second input inductor 355 may be coupled to a second reference voltage (labeled V Ref 2 in FIG. 3A), which may be a DC reference voltage. The first reference voltage V Ref 1 and the second reference voltage V Ref 2 may be the same or different voltages.

Power amplifier 300 includes first and second phase conditioners 360 and 365. The first and the second phase conditioners 360 and 365 are generally defined by surrounding dashed lines in FIG. 3A. The first phase conditioner 360 is configured to condition the phase of the received AC signal received by the power amplifier at input 350a. Specifically, the phase conditioner is configured to condition the phase of the received AC signal at the gate 305a of transistor 305 and condition the phase of the AC signal at the third inductor 340. More specifically, first phase conditioner 360 is configured such that the phase of the AC signal at gate 305c of transistor 305 is 180 degrees out of phase with the AC signal at the ground side of third inductor 340. By providing that the AC signal received at the gate 305a of transistor 305 is 180 degrees out of phase with the AC signal of the third inductor 340, first phase conditioner 360 is further configured such that the phase of the AC signal across first inductor 315 and third inductor 340 are in phase.

The second phase conditioner 365 is configured to condition the phase of the received AC received by power amplifier 300 at input 355a. Specifically, second phase conditioner 365 is configured to condition the phase of the received AC signal at gate 310a of transistor 310 and at the fourth inductor 345. More specifically, the second phase conditioner is configured such that the phase of the AC signal at gate 310a of transistor 310 is 180 degrees out of phase with the AC signal at the voltage source Vdd side of the fourth inductor 345. By providing that the AC signal received at the gate 310a of transistor 310 is 180 degrees out of phase with the AC signal of the fourth inductor 345, the second phase conditioner is further configured such that the phase of the AC signal across second inductor 320 and fourth inductor 345 are in phase.

The first and second phase conditioners 360 and 365 further provide that the phase of the AC signals across the first, second, third, and fourth inductors 315, 320, 340, and 345 are substantially in phase. Providing that the AC signals across first and the third inductors 315 and 340 are in phase ensures that the AC signal across first inductor 315 may have a higher maximum amplitude than if the source 305b of transistor 305 were coupled to ground (i.e., if third inductor 340 were not present). That is, the energy stored in third inductor 340 may be released into first inductor 315 driving the maximum amplitude of the AC signal at first inductor 315 above 2Vdd. Stated alternatively, the source voltage Vs and the drain voltage Vd of transistor 305 swing substantially in phase. Therefore, when Vds (voltage across the source and drain) is at a maximum amplitude, which is from 2Vdsat (2 times the drain voltage at full saturation of transistor 305) to 2Vdd−2Vdsat, the drain voltage Vd is pushed to a relatively high maximum voltage by the source voltage Vs. With the AC signal across first inductor 315 swinging above 2Vdd, the power output from power amplifier 300 is relatively increased compared to traditional power amplifiers. For example, the power may be increased by as much as 2 dB compared to traditional power amplifiers.

Similarly, providing that the AC signals across the second and the fourth inductors 320 and 345 are in phase provides that the AC signal across second inductor 320 may have a higher maximum amplitude than if the source 310b of transistor 310 where coupled to Vdd (i.e., if the fourth inductor were not present). That is, the energy stored in fourth inductor 345 may be released into second inductor 320 driving the maximum amplitude of the AC signal at the second inductor above 2Vdd. Stated alternatively, the source voltage Vs and the drain voltage Vd of transistor 310 swing substantially in phase. Therefore, when Vds is at a maximum amplitude, which is from 2Vdsat to 2Vdd−2Vdsat, the drain voltage Vd is pushed to a relatively high maximum voltage by the source voltage Vs. With the AC signal across second inductor 320 swinging above 2Vdd, the power output from power amplifier 300 is relatively increased compared to traditional power amplifiers. For example, the power may be increased by as much as 2 dB compared to traditional power amplifiers.

According to one embodiment of the present invention, first phase conditioner 360 is configured to receive the AC signal from a first amplifier 360a (such as an op-amp). First phase conditioner may include a first transformer inductor 360b, and second transformer inductor 360c. The first transformer inductor 360b may be inductively coupled to the first input inductor 350 forming a transformer therewith so as to condition the phase of the AC signal at gate 305a as described above. The second transformer inductor 360c may be inductively coupled to third inductor 340 forming a transformer therewith so as to condition the phase of the AC signal at the ground side of third inductor 340 as described above. First phase conditioner 360 may also include a first tank capacitor 360d in parallel (i.e., in a tank configuration) with first transformer inductor 360b. First phase conditioner 360 may also include a second tank capacitor 360e in a tank configuration with second transformer inductor 360c. According to one embodiment, first amplifier 360a is configured to receive an AC input, which may be the output from a previous stage power amplifier or the like. First amplifier 360a, first transformer inductor 360b, and second transformer inductor 360c may be disposed in series. More specifically, an output of first amplifier 360a may be coupled to a first end of first transformer inductor 360b, and a second end of first transformer inductor 360b may be coupled to a first end of second transformer inductor 360c. A second end of second transformer inductor 360c is coupled to ground.

According to another embodiment of the present invention, second phase conditioner 365 is configured to receive the AC signal from a second amplifier 365a (such as an op-amp). The second phase conditioner may include a third transformer inductor 365b, and a fourth transformer inductor 365c. The third transformer inductor 365b may be inductively coupled to the second input inductor 355 forming a transformer therewith so as to condition the phase of the AC signal at gate 310a as described above. The fourth transformer inductor 365c may be inductively coupled to the fourth inductor 345 forming a transformer therewith so as to condition the phase of the AC signal at the voltage source Vdd side of fourth inductor 345 as described above. The second phase conditioner 365 may also include a third tank capacitor 365d in a tank configuration with third transformer inductor 365b. The second phase conditioner 365 may also include a fourth tank capacitor 365e in a tank configuration with fourth transformer inductor 365c. According to one embodiment, second amplifier 365a is configured to receive an AC input, which may be the output from the previous stage power amplifier or the like. The AC input received by the second amplifier 365a may be the same input received by the first amplifier 360a. Second amplifier 365a, third transformer inductor 365b, and fourth transformer inductor 365c may be disposed in series. More specifically, an output of second amplifier 365a may be coupled to a first end of third transformer inductor 365b, and a second end of third transformer inductor 365b may be coupled to a first end of fourth transformer inductor 365c. A second end of fourth transformer inductor 365c is coupled to ground or may be coupled to the voltage source Vdd. According to one embodiment, the first amplifier 360a and the second amplifier 365a are configured to deliver the same AC signal to AC inputs 350a and 355a. The first amplifier 360a and the second amplifier 365a may form portions of a previous stage amplifier. According to one specific embodiment, the first amplifier 350a and the second amplifier 355a may be the same amplifier circuit, which may be a previous stage amplifier.

Figure 3B:
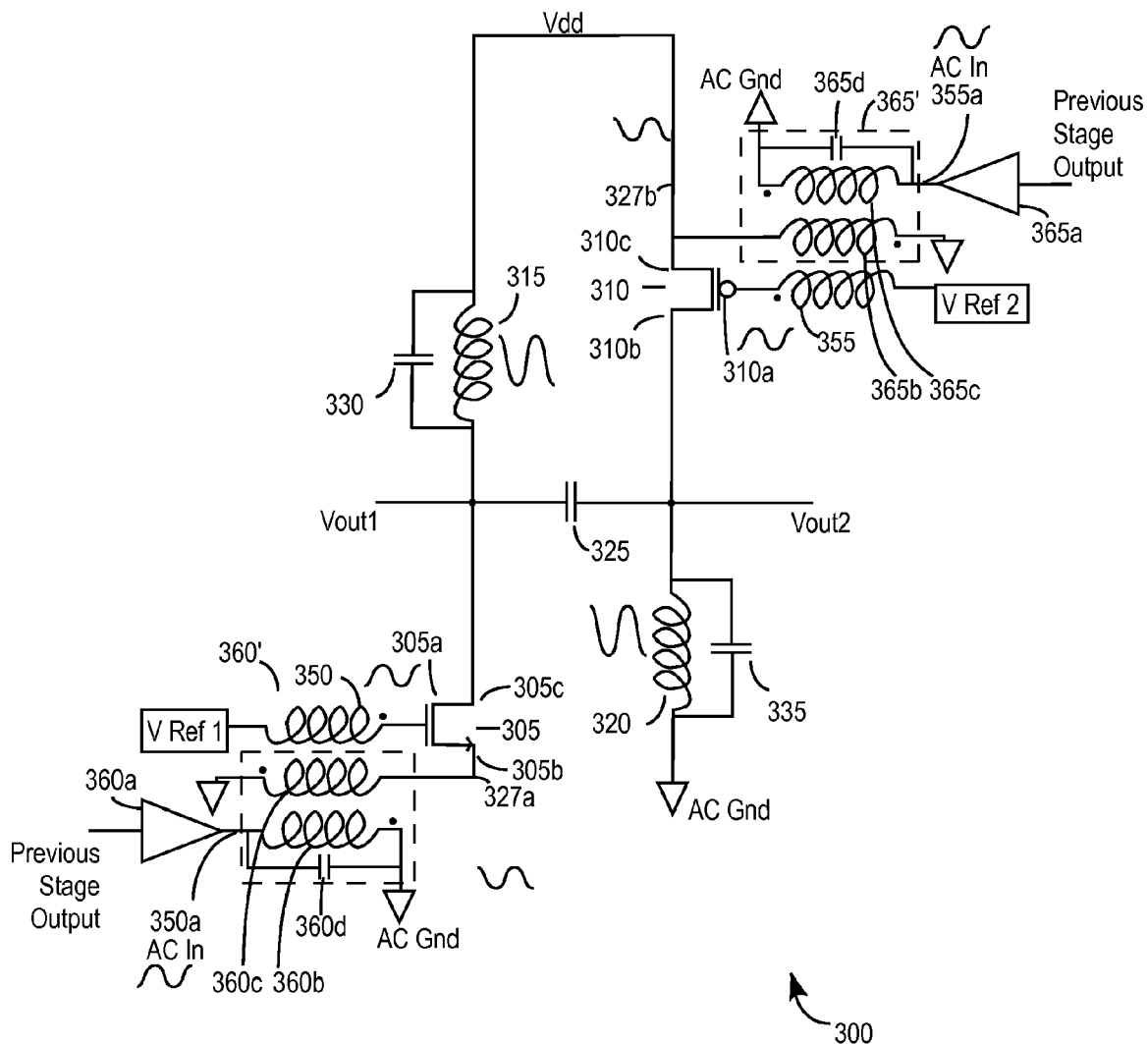
FIG. 3B is a simplified schematic of a power amplifier according to another embodiment.

FIG. 3B is a simplified schematic of a power amplifier 300' according to another embodiment. The same numbering schema used above with respect to power amplifier 300 to identify elements of power amplifier 300' is used to identify the same elements or substantially similar elements of power amplifier 300'. Power amplifier 300' is substantially similar to power amplifier 300 but differs in that the phase conditioners 360' and 365' of power amplifier 300' are different from phase conditioners 360 and 365. More specifically, power amplifier 300 is substantially similar to power amplifier 300 in that phase conditioner 360' is configured to set the phase the AC signal at the gate 305a of transistor 305 180 degree out of phase with the AC signal at source 305b of transistor 305, and phase conditioner 365' is configured to set the phase the AC signal at the gate 310a of transistor 310 180 degree out of phase with the AC signal at source 310c of transistor 310. Note that in power amplifier embodiment 300' the source 305b of transistor 305 may not be coupled to ground, while the second end of second inductor 320 is coupled to ground.

Phase conditioners 360' and 365' are described in further detail immediately below. Phase conditioner 360' includes the first transformer inductor 360b inductively coupled to the second transformer inductor 360c and inductively coupled to the first input inductor 350. Phase conditioner 360' further includes the second transformer inductor 360c inductively coupled to the first input inductor 350. First transformer inductor 360b includes a first end coupled to the output of the first amplifier 360a and includes a second end coupled to AC ground. Second transformer inductor 360c includes a first end coupled to AC ground and a second end coupled to a first node 327a (which may be coupled to the source 305b of transistor 305). First input inductor 350 includes a first end coupled to the first reference voltage (labeled V Ref 1 in FIG. 3B), which may be a DC bias voltage, and a second end coupled to the gate 305a of transistor 305.

The first transformer inductor 360b, the second transformer inductor 360c, and the first input inductor 350 are configured to set the phase of the AC signal received at input 350a 180 degrees out of phase with the AC signal at the first node 327a. The first transformer inductor 360b, the second transformer inductor 360c, and the first input inductor 350 are further configured to set the phase of the AC signal received at input 350a in phase with the AC signal at the gate 305a of transistor 305 and 180 degrees out of phase with the AC signal at the first mid-node 327a.

Phase conditioner 365' includes the third transformer inductor 365b inductively coupled to the fourth transformer inductor 365c and inductively coupled to the second input inductor 355. Phase conditioner 365' further includes the fourth transformer inductor 365c inductively coupled to the second input inductor 355. Third transformer inductor 365b includes a first end coupled to the output of the second amplifier 365a and includes a second end coupled to AC ground. Fourth transformer inductor 365c includes a first end coupled to AC ground and a second end coupled to a second node 327b (which may be coupled to the source 310c of transistor 310). Second input inductor 355 includes a first end coupled to the second reference voltage (labeled V 2 Ref in FIG. 3B), which may be a DC bias voltage, and a second end coupled to the gate 310a of transistor 310. As described above, the first reference voltage V Ref 1 may be the same voltage or a different voltage than the second reference voltage V Ref 2.

The third transformer inductor 365b, the fourth transformer inductor 365c, and the second input inductor 355 are configured to set the phase of the AC signal received at input 355a 180 degrees out of phase with the AC signal at the second mid-node 327b. The third transformer inductor 365b, the fourth transformer inductor 365c, and the second input inductor 355 are further configured to set the phase of the AC signal received at input 355a in phase with the AC signal at the gate 310a of transistor 310 and 180 degrees out of phase with the AC signal at the second mid-node 327b. Power amplifier 300' is configured to provide substantially the same power output increase as power amplifier 300 described above where energy stored in second transformer inductor 360c is released into first inductor 315 to increase the amplitude of the AC signal at the first inductor 315, and energy stored in second transformer inductor 365c is released into second inductor 320 to increase the amplitude of the AC signal at the second inductor 320.

Figure 4:
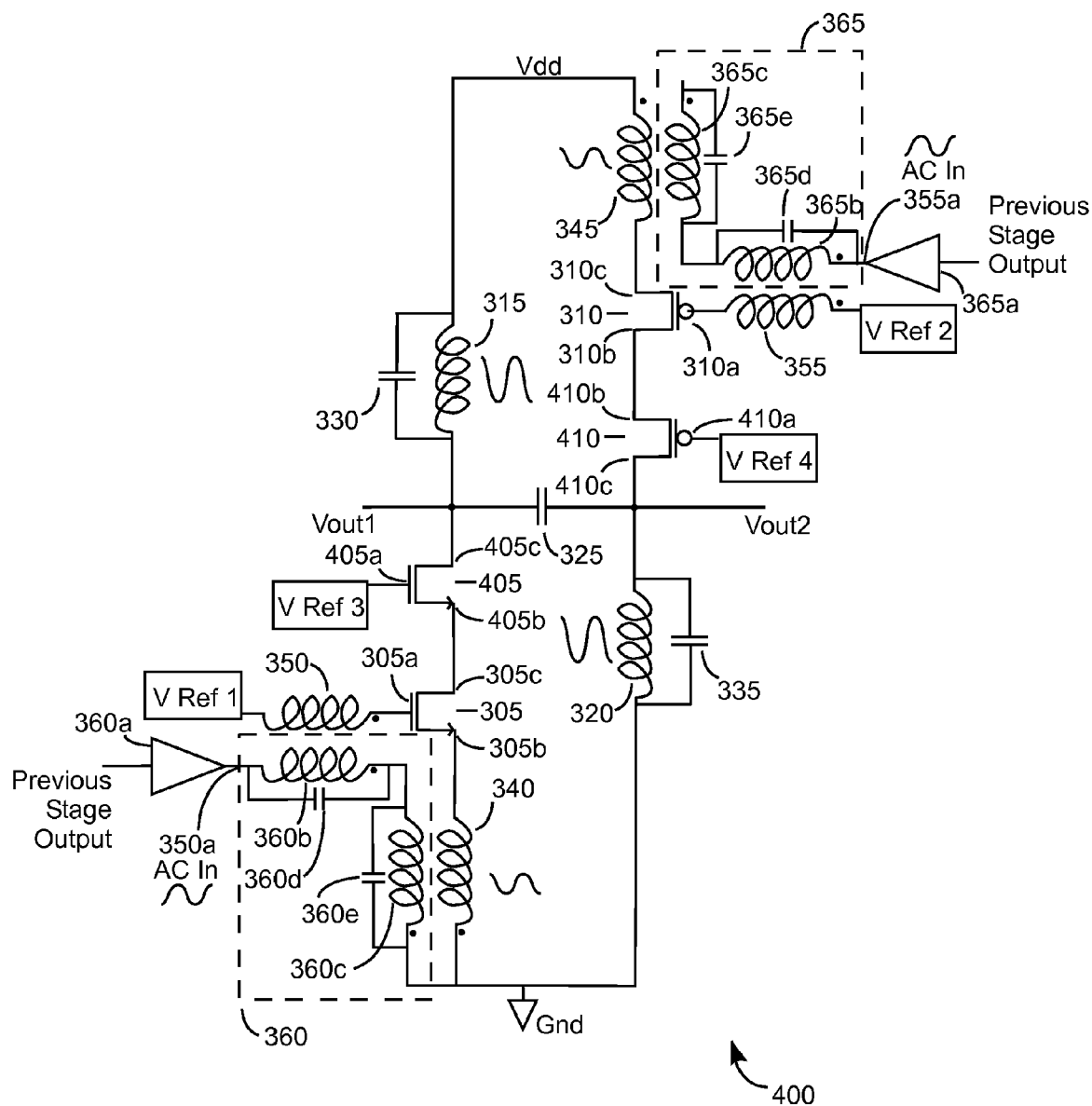
FIG. 4 is a simplified schematic of a power amplifier, which includes a pair of cascodes, according to another embodiment of the present invention.

FIG. 4 is a simplified schematic of a power amplifier 400 according to another embodiment of the present invention. Power amplifier 400 is substantially similar to power amplifier 300 but differs in that power amplifier 400 includes a transistor 405 (e.g., an nMOS transistor) disposed between transistor 305 and the first inductor 315, and includes a transistor 410 (e.g., a pMOS transistor) disposed between transistor 310 and second inductor 320. Transistors 305 and 405 may be in a cascode configuration with a, respective, common source, common ground configuration. More specifically a source 405b of transistor 405 may be coupled to the drain 305c of transistor 305, and a drain 405c of transistor 405 may be coupled to the first end of first inductor 315 where the second end of first inductor 315 is coupled to the voltage source Vdd. A gate 405a of transistor 405 may be coupled to a third reference voltage (labeled V Ref 3 in FIG. 4) to relatively strongly turn on transistor 405.

Transistors 310 and 410 may similarly be in a cascode configuration with a, respective, common source, common ground configuration. More specifically a source 410b of transistor 410 may be coupled to the drain 310b of transistor 310, and a drain 410c of transistor 410 may be coupled to the first end of second inductor 320 where the second end of inductor 320 is coupled to ground. A gate 410a of transistor 410 may be coupled to a fourth reference voltage (labeled V Ref 4 in FIG. 4) to relatively strongly turn on transistor 410. The first reference voltage V Ref 1, the second reference voltage V Ref 2, the third reference voltage V Ref 3, and the fourth reference voltage V Ref 4 may be the same or different voltages. The cascode configuration of the transistors provide for stress protection of power amplifier 400 as will be well understood by those of skill in the art. Power amplifier 400 is substantially similar to power amplifier 300 in that the third inductor 340 is configured to raise the maximum voltage of the of the AC signal across the first inductor 315, and the fourth inductor 345 is configured to raise the maximum voltage of the AC signal across the second inductor 320. As described above, raising the maximum voltages across first inductor 315 and second inductor 320 increases the power output from voltage outputs Vout1 and Vout2 of a power amplified AC signal amplified by power amplifier 400.

Figure 5:
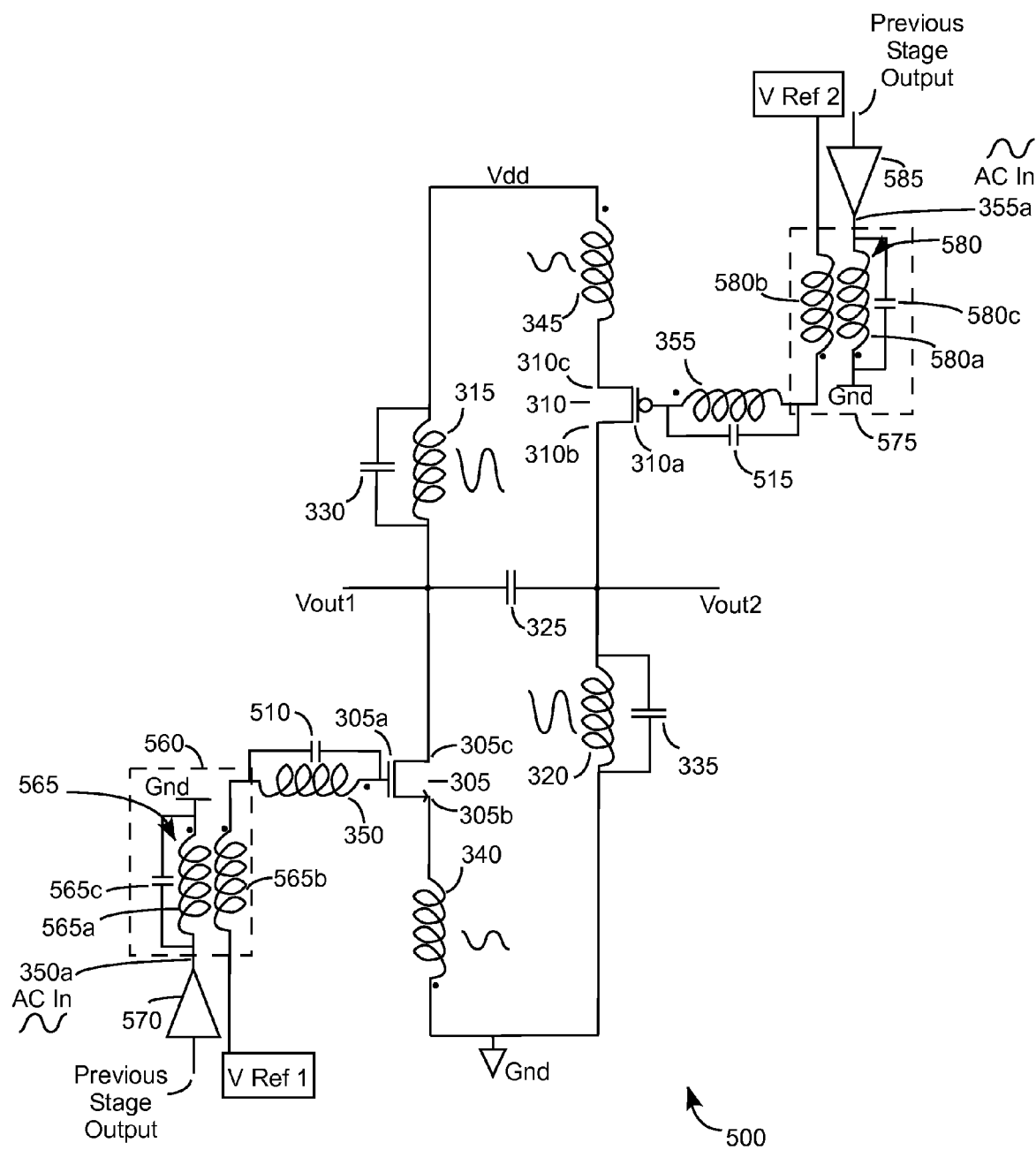
FIG. 5 is a simplified schematic of a power amplifier according to another embodiment of the present invention.

FIG. 5 is a simplified schematic of a power amplifier 500 according to another embodiment of the present invention. Power amplifier 500 is substantially similar to power amplifier 300 but differs in that first and second phase conditioners 560 and 575 of power amplifier 500 have different configurations from the configurations of the first and the second phase conditioners 360 and 365. The first and the second phase conditioners 560 and 575 are generally defined by surrounding dashed lines in FIG. 5. The same numbering schema used above with respect to power amplifiers 300 and 400 is used to identify the same or substantially similar elements of power amplifier 500.

According to one embodiment, the first input inductor 350 is inductively coupled to the third inductor 340 to form a transformer therewith. The phase of the AC signal at a side of the first input inductor 350 nearest gate 305a is in phase with the AC signal at an end of the third inductor 340 nearest ground, and is 180 degrees out of phase with the AC signal at the end of the third inductor 340 coupled to source 305b of transistor 305. Note the phase dots in FIG. 5 which indicate points of the same phase of the formed transformers. Power amplifier 500 may include a first input capacitor 510 coupled in a tank configuration with the first input inductor 350. Power amplifier 500 may also include a second input capacitor 515 coupled in a tank configuration with the second input inductor 355.

According to one embodiment, the first phase conditioner 560 includes a transformer 565 that includes a first transformer inductor 565a and a second transformer inductor 565b. The first phase conditioner 560 may also include a capacitor 565c coupled in a tank configuration to the first transformer inductor 565a. A first end of the first transformer inductor 565a may be coupled to an output of an amplifier 570, which may be an op-amp and may be the AC input 350a. A second end of the first transformer inductor 565a may be coupled to ground. A first end of the second transformer inductor 565b may be coupled to the first reference voltage V Ref 1. A second end of the second transformer inductor 565b may be coupled to one end of the first input inductor 350 where the second transformer inductor 565b and the first input inductor 350 are in series. An input of amplifier 570 may be the output of a prior amplification stage or the like.

The second phase conditioner 575 includes a transformer 580 that includes a first transformer inductor 580a and a second transformer inductor 580b. The second phase conditioner 575 may also include a capacitor 580c coupled in a tank configuration to the first transformer inductor 580a. A first end of the first transformer inductor 580a may be coupled to an output of an amplifier 585, which may be an op-amp and may be the AC input 355a. A second end of the first transformer inductor 580a may be coupled to ground. A first end of the second transformer inductor 580b may be may be coupled to the second reference voltage V Ref 2. A second end of the second transformer inductor 580b may be coupled to one end of the second input inductor 355 where the second transformer inductor 580b and the second input inductor 355 are in series. An input of amplifier 585 may be the output of a prior amplification stage or the like.

The first phase conditioner 560 is configured to set the phase of the AC signal received at AC input 350a so that the phase of the AC signal at the gate 305a of transistor 305 and the phase of the AC signal at the grounded side of third inductor 340 are in phase, and so that the phase of the AC signal across the first inductor 315 and the third inductor 340 are in phase. The second phase conditioner 575 is similarly configured to set the phase of the AC signal received at AC input 355a so that the phase of the AC signal at the gate 310a of transistor 310 and the phase of the AC signal at the Vdd side of the fourth inductor 345 are in phase, and so that the phase of the AC signal across the second inductor 320 and the fourth inductor 345 are in phase. As described above with respect to power amplifier 300, with the phase of the AC signal across the first inductor 315 and the third inductor 340 in phase, the maximum voltage of the AC signal across the first inductor 315 and at the first output Vout1 rises above 2Vdd to increase the power output by the power amplifier. Also as described above with respect to power amplifier 300, with the phase of the AC signal across the second inductor 320 and the fourth inductor 345 in phase, the maximum voltage of the AC signal across the second inductor 320 and at the second output Vout2 rises above 2Vdd to increase the power output by the power amplifier 500.

Figure 6:
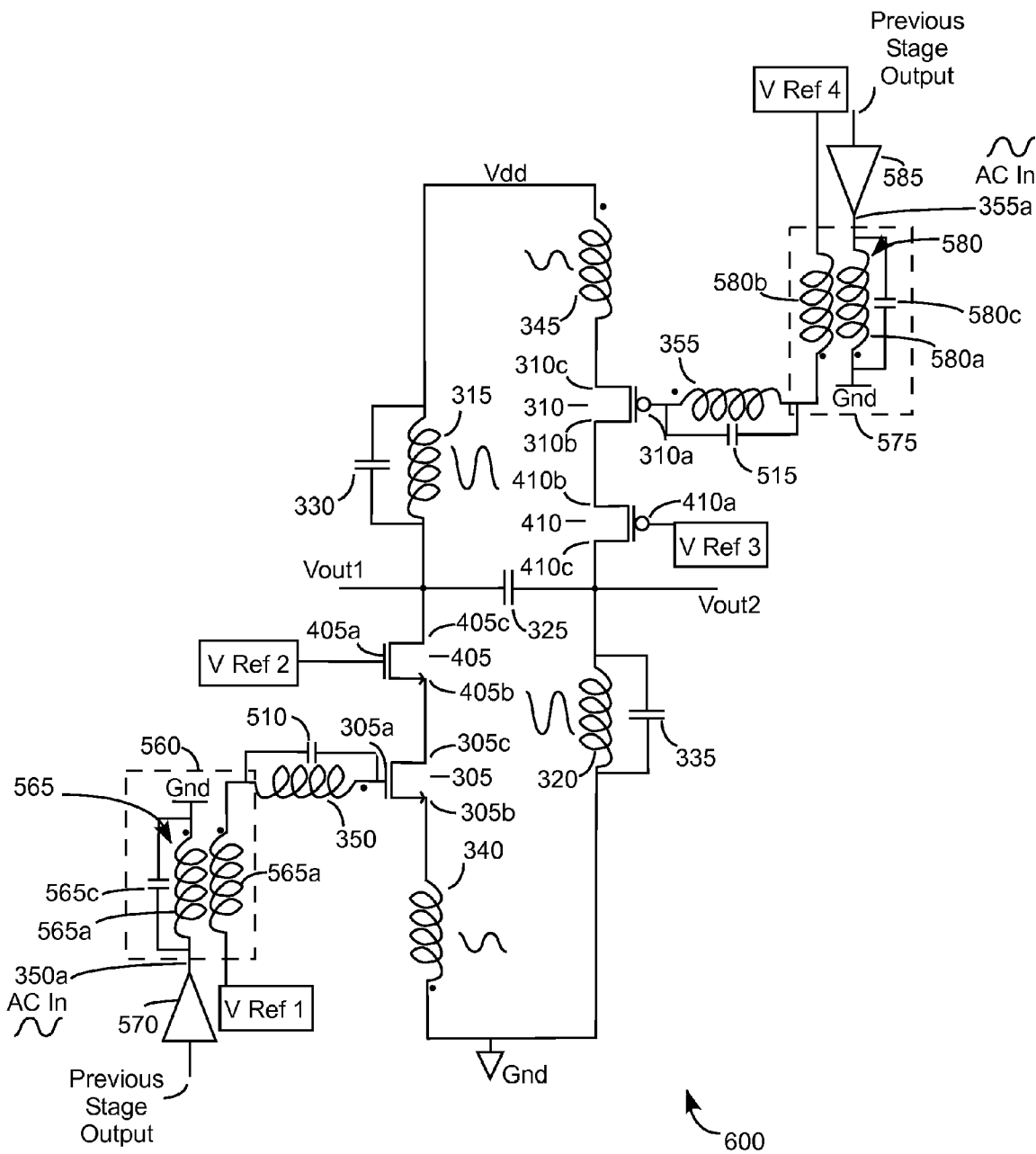
FIG. 6 is a simplified schematic of a power amplifier according to another embodiment of the present invention

FIG. 6 is a simplified schematic of a power amplifier 600 according to another embodiment of the present invention. Power amplifier 600 is substantially similar to power amplifier 500 described above but differs in that power amplifier 600 includes transistor 405 disposed between transistor 305 and the first inductor 315, and includes transistor 410 disposed between transistor 310 and second inductor 320. As described above, the cascode configuration of the transistors provide for stress protection of power amplifier 600 as will be well understood by those of skill in the art. Power amplifier 600 is substantially similar to power amplifier 500 in that the third inductor 340 is configured to raise the maximum voltage of the AC signal across the first inductor 315 and at the first output Vout1, and the fourth inductor 345 is configured to raise the maximum voltage of the AC signal across the second inductor 320 and at the second output Vout2. As described above, raising the maximum voltages across the first inductor 315 and the second inductor 320 increases the power output of a power amplified AC signal amplified by power amplifier 600.

According to one embodiment, two power amplifiers 300, two power amplifiers 400, two power amplifiers 500, or two power amplifiers 600, may be inductively coupled by a combiner to form a fully differential power amplifier as will be well understood by those of skill in the art.

Figure 7:
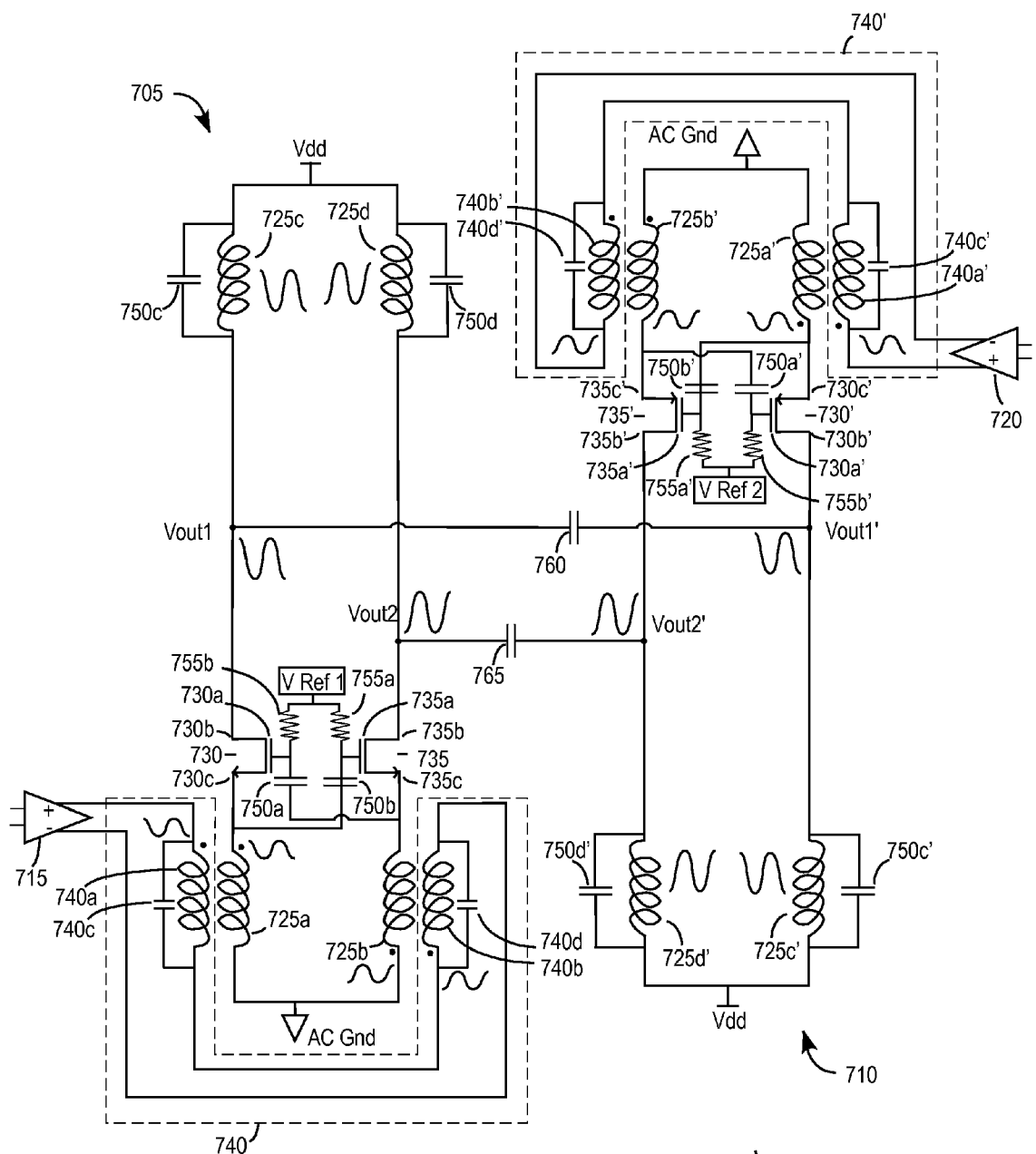
FIG. 7 is a simplified schematic of a fully-differential power amplifier 700 according to one embodiment.

FIG. 7 is a simplified schematic of a fully-differential power amplifier 700 according to one embodiment. Fully-differential power amplifier 700 includes a first power amplifier 705 and a second power amplifier 710. First power amplifier 705 is configured to amplify the differential AC signals provided to the first power amplifier 705 by a first amplifier 715. Second power amplifier 710 is configured to amplify the differential AC signals provided to the second power amplifier 710 by a second amplifier 720.

The first amplifier 715 and the second amplifier 710 may be the amplifier of a previous amplification stage. The AC signals provided by the first amplifier 715 and the second amplifier 710 are the same AC signals. According to one embodiment, the first amplifier 715 and the second amplifier 720 are the same amplifier.

According to one embodiment, first power amplifier 705 includes a first inductor 725a and a second inductor 725b (e.g., input inductors). The first power amplifier further includes a first transistor 730 where the first inductor 725a is coupled between a source 730c of transistor 730 and an AC ground. The first power amplifier further includes a second transistor 735 where the second inductor 725b is coupled between a source 735c of transistor 735 and the AC ground.

First power amplifier 705 also includes a phase conditioner 740 configured to inductively transfer the AC signal from first amplifier 715 to first and second inductors 725a and 725b. Phase conditioner 740 is generally identified by a surrounding dashed line. Phase conditioner 740 may include a first transformer inductor 740a serially coupled to a second transformer inductor 740b. First transformer inductor 740a may be coupled in parallel (i.e., tank configuration) with a tank capacitor 740c. Second transformer inductor 740b may be coupled in parallel (i.e., tank configuration) with a tank capacitor 740d. According to one embodiment, first transformer inductor 740a is inductively coupled to first inductor 725a, and second transformer inductor 740b is inductively coupled to second inductor 725b.

According to a further embodiment, first power amplifier 705 further includes a first capacitor 750a and a second capacitor 750b. A first end of capacitor 750a is coupled to source 730c of transistor 730 and to first inductor 725a, and a second end of capacitor 750a is coupled to a gate 735a of transistor 735. A first end of capacitor 750b is coupled to source 735c of transistor 735 and to second inductor 725b, and a second end of capacitor 750b is coupled to a gate 730a of transistor 730. The gate 735a of transistor 735 is also coupled to the first reference voltage V Ref 1 via a first resistor 755a, and the gate 730a of transistor 730 is also coupled to the reference voltage via a second resistor 755b. The first reference voltage may be a DC reference voltage. According to one embodiment, the first phase conditioner 740 and the first and second capacitors 750a and 750b are configured to set the phase of the AC signal at source 730c 180 degrees with the AC signal at gate 730a, and set the phase the AC signal at source 735c 180 degrees out of phase with the AC signal at gate 735a.

First power amplifier 705 further includes a third inductor 725c disposed in parallel with a capacitor 750c (tank configuration) where the third inductor 725c has a first end coupled to a drain 730b of transistor 730 and a voltage source (labeled Vdd in FIG. 7). First power amplifier 705 further includes a fourth inductor 725d disposed in parallel with a capacitor 750d (tank configuration) where the fourth inductor 725d has a first end coupled to a drain 735b of transistor 735 and the voltage source.

The AC signal across first and third inductors 725a and 725c are in phase and bounce in phase as described above with respect to other embodiment. As described above, the AC signal in the first inductor 725a releases its stored energy into the third inductor 725c so that the AC signal at the first output node Vout 1 (between inductor 725c and drain 730b) may bounce relatively high to provide a relatively high power output. Similarly, the AC signal across second and fourth inductors 725b and 725d are in phase and bounce in phase. As described above, the AC signal in the second inductor 725b releases its stored energy into the third inductor 725d so that the AC signal at the second output node Vout 2 (between inductor 725d and drain 735b) may bounce relatively high to provide a relatively high power output.

Second power amplifier 710 is substantially similarly configured to first power amplifier 705. The same reference number schema is used to identity substantially similar elements of the first power amplifier 705 and second power amplifier 710 but with primes used with the reference numbers for second power amplifier 710. According to one embodiment, second power amplifier 710 includes a first inductor 725a' and a second inductor 725b' (e.g., input inductors). The first power amplifier further includes a first transistor 730' where the first inductor 725a' is coupled between a source 730c' of transistor 730' and an AC ground. The first power amplifier further includes a second transistor 735' where the second inductor 725b' is coupled between a source 735c' of transistor 735' and the AC ground.

First power amplifier 710 also includes a phase conditioner 740' configured to inductively transfer the AC signal from first amplifier 715' to first and second inductors 725a' and 725b'. Phase conditioner 740' is generally identified by a surrounding dashed line. Phase conditioner 740' may include a first transformer inductor 740a' serially coupled to a second transformer inductor 740b'. First transformer inductor 740a' may be coupled in parallel (i.e., tank configuration) with a tank capacitor 740c'. Second transformer inductor 740b' may be coupled in parallel (i.e., tank configuration) with a tank capacitor 740d'. According to one embodiment, first transformer inductor 740a' is inductively coupled to first inductor 725a', and second transformer inductor 740b' is inductively coupled to second inductor 725b'.

According to a further embodiment, first power amplifier 710 further includes a first capacitor 750a' and a second capacitor 750b'. A first end of capacitor 750a' is coupled to source 730c' of transistor 730' and to first inductor 725a', and a second end of capacitor 750a' is coupled to a gate 735a' of transistor 735'. A first end of capacitor 750b' is coupled to source 735c' of transistor 735' and to second inductor 725b', and a second end of capacitor 750b' is coupled to a gate 730a' of transistor 730'. The gate 735a' of transistor 735' is also coupled to the second reference voltage V Ref 2 via a first resistor 755a', and the gate 730a' of transistor 730' is also coupled to the second reference voltage V Ref 2 via a second resistor 755b'. The second reference voltage V Ref 2 may be a DC reference voltage. According to one embodiment, the first phase conditioner 740' and the first and second capacitors 750a' and 750b' are configured to set the phase of the AC signal at source 730c' 180 degrees with the AC signal at gate 730a', and set the phase the AC signal at source 735c' 180 degrees out of phase with the AC signal at gate 735a'.

First power amplifier 710 further includes a third inductor 725c' disposed in parallel with a capacitor 750c' (tank configuration) where the third inductor 725c' has a first end coupled to a drain 730b' of transistor 730' and the voltage source (e.g., Vdd). First power amplifier 710 further includes a fourth inductor 725d' disposed in parallel with a capacitor 750d' (tank configuration) where the fourth inductor 725d' has a first end coupled to a drain 735b' of transistor 735' and the voltage source.

The AC signal across first and third inductors 725a' and 725c' are in phase and bounce in phase as described above with respect to other embodiment. As described above, the AC signal in the first inductor 725a' releases its stored energy into the third inductor 725c' so that the AC signal at the first output node Vout 1' (between inductor 725c' and drain 730b') may bounce relatively high to provide a relatively high power output. Similarly, the AC signal across second and fourth inductors 725b' and 725d' are in phase and bounce in phase. As described above, the AC signal in the second inductor 725b' releases its stored energy into the third inductor 725d' so that the AC signal at the second output node Vout 2' (between inductor 725d' and drain 735b') may bounce relatively high to provide a relatively high power output.

According to one embodiment the first outputs Vout 1 and Vout 1' are coupled via a capacitor 760 which may be configured to cancel higher order harmonics of the AC signal at the first outputs Vout 1 and Vout 1'. According a further embodiment the second outputs Vout 2 and Vout 2' are coupled via a capacitor 765 which may be configured to cancel higher order harmonics of the AC signal at the second outputs Vout 2 and Vout 2'.

Figure 8:
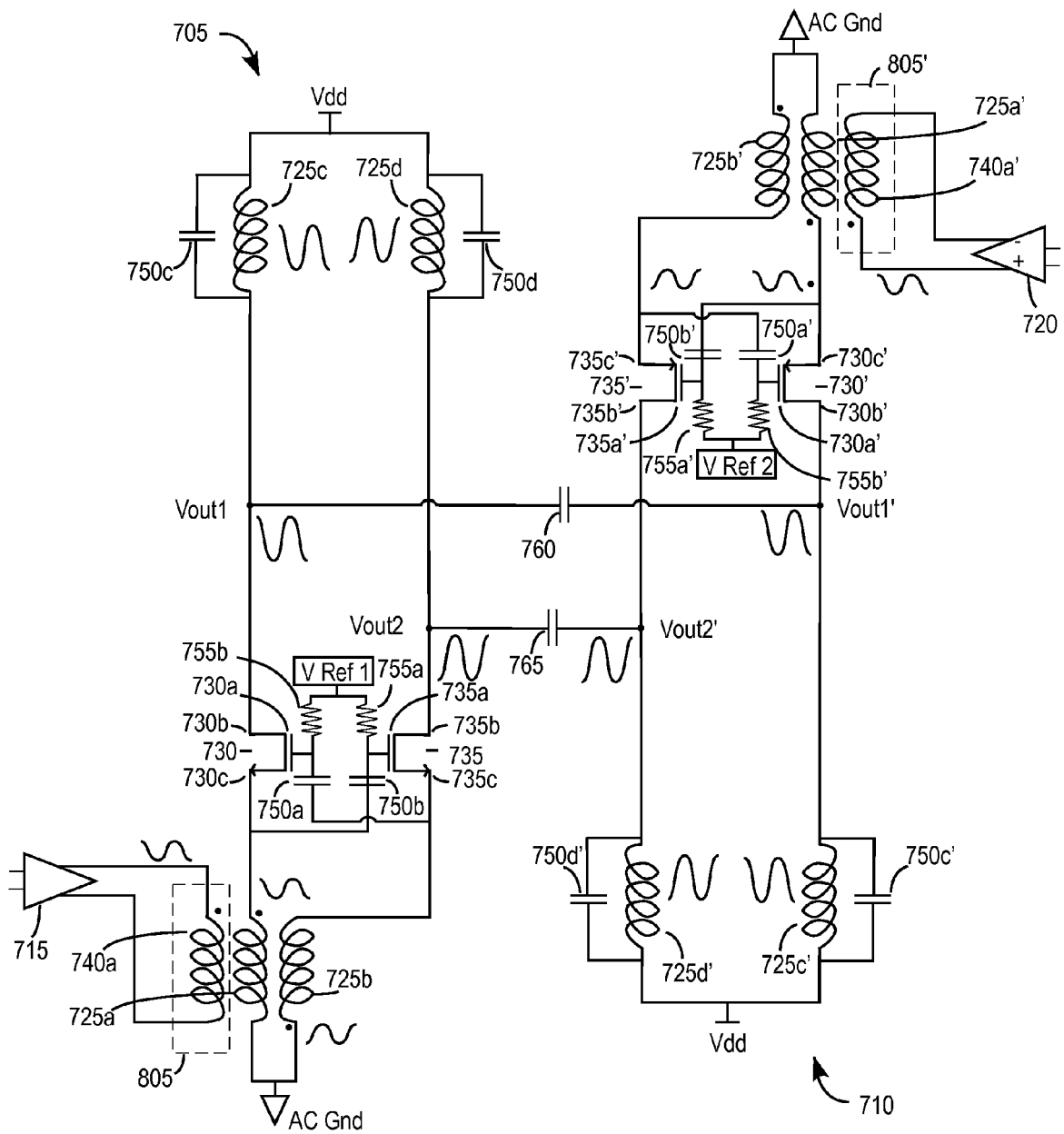
FIG. 8 is a simplified schematic of a fully-differential power amplifier 800 according to another embodiment.

FIG. 8 is a simplified schematic of a fully-differential power amplifier 800 according to another embodiment. The same number scheme used to identify elements of fully-differential power amplifier 700 is used to identify the same elements or substantially similar elements of fully-differential power amplifier 800. Fully-differential power amplifier 800 is substantially similar to fully-differential power amplifier 700 but differs from fully-differential power amplifier 700 in that fully-differential power amplifier 800 includes first and second phase conditioners 805 and 805' that differ from first and second phase conditioners 740 and 740'. Specifically, first phase conditioner 805 includes first transformer inductor 740a inductively coupled to first and second input inductors 725a and 725b. Further, the second phase conditioner 805' includes first phase conditioner 704a' inductively coupled to first and second input inductors 725a' and 725b'.

First transformer inductor 740a is configured to set the phases of AC signals opposite ends of first and second input inductors 725a and 725b 180 degrees out of phase. Further, the first phase conditioner 740 (e.g., first transformer inductor 740a) and the first and second capacitors 750a and 750b are configured to set the phase of the AC signal at source 730c 180 degrees with the AC signal at gate 730a, and set the phase the AC signal at source 735c 180 degrees out of phase with the AC signal at gate 735a. Similarly, first transformer inductor 740a' is configured to set the phases of AC signals opposite ends of first and second input inductors 725a' and 725b' 180 degrees out of phase. Further, the first phase conditioner 740' (e.g., first transformer inductor 740a') and the first and second capacitors 750a' and 750b' are configured to set the phase of the AC signal at source 730c' 180 degrees with the AC signal at gate 730a', and set the phase the AC signal at source 735c' 180 degrees out of phase with the AC signal at gate 735a'. The described phases provides that the AC signals at the outputs bounce relatively high as described above to increase the power output of fully-differential power amplifier 800.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A power amplifier configured to boost an AC signal, the power amplifier comprising:
    a first transistor configured to receive the AC signal;
    a first inductor connected between the first transistor and a voltage source, the first inductor configured to receive the AC signal via the first transistor;
    a first phase conditioner inductively coupled with an input of the first transistor, the first phase conditioner configured to (i) receive the AC signal, and (ii) condition a phase of the AC signal such that the AC signal as received by the first transistor is out of phase with respect to the AC signal as received by the first inductor;
    a second transistor configured to receive the AC signal;
    a second inductor connected between the second transistor and ground, the second inductor configured to receive the AC signal via the second transistor; and
    a second phase conditioner inductively coupled with an input of the second transistor, the second phase conditioner configured to (i) receive the AC signal, and (ii) condition a phase of the AC signal such that the AC signal as received by the second transistor is out of phase with respect to the AC signal as received by the second inductor.

2. A power amplifier configured to boost an AC signal, the power amplifier comprising:
    a first transistor configured to receive the AC signal;
    a first inductor connected between the first transistor and a voltage source, the first inductor configured to receive the AC signal via the first transistor;
    a first phase conditioner arranged at an input of the first transistor, the first phase conditioner configured to (i) receive the AC signal, and (ii) condition a phase of the AC signal such that the AC signal as received by the first transistor is out of phase with respect to the AC signal as received by the first inductor;
    a second transistor configured to receive the AC signal;
    a second inductor connected between the second transistor and ground, the second inductor configured to receive the AC signal via the second transistor;
    a second phase conditioner arranged at an input of the second transistor, the second phase conditioner configured to (i) receive the AC signal, and (ii) condition a phase of the AC signal such that the AC signal as received by the second transistor is out of phase with respect to the AC signal as received by the second inductor;
    a first capacitor connected in parallel with the first inductor, the first capacitor configured to tune a resonant frequency of the first inductor; and
    a second capacitor connected in parallel with the second inductor, the second capacitor configured to tune a resonant frequency of the second inductor.

3. The power amplifier of claim 1, further comprising:
    a third inductor connected between the first transistor and ground, wherein, to condition the phase of the AC signal such that the AC signal as received by the first transistor is out of phase with respect to the AC signal as received by the first inductor, the first phase conditioner is configured to condition a phase of the AC signal as received by the third inductor; and
    a fourth inductor connected between the second transistor and the voltage source, wherein, to condition the phase of the AC signal such that the AC signal as received by the second transistor is out of phase with respect to the AC signal as received by the second inductor, the second phase conditioner is configured to condition a phase of the AC signal as received by the fourth inductor.

4. The power amplifier of claim 3, further comprising:
a fifth inductor provided at an input of the first transistor, the fifth inductor configured to bias the first transistor according to a first reference voltage; and
a sixth inductor provided at an input of the second transistor, the sixth inductor configured to bias the second transistor according to a second reference voltage.

5. The power amplifier of claim 4, wherein
the first phase conditioner includes (i) a seventh inductor inductively coupled to the fifth inductor and (ii) an eighth inductor inductively coupled to the third inductor, and
the second phase conditioner includes (i) a ninth inductor inductively coupled to the sixth inductor and (ii) a tenth inductor inductively coupled to the fourth inductor.

6. The power amplifier of claim 5, further comprising:
a first amplifier configured to provide an input signal to the seventh inductor; and
a second amplifier configured to provide the input signal to the ninth inductor.

7. The power amplifier of claim 6, wherein the input signal corresponds to an output of a previous amplifier stage.

8. The power amplifier of claim 3, wherein (i) the AC signal as received by the first inductor is in phase with the AC signal as received by the third inductor and (ii) the AC signal as received by the second inductor is in phase with the AC signal as received by the fourth inductor.

9. The power amplifier of claim 1, wherein (i) the AC signal as received by the first transistor is out of phase with respect to the AC signal as received by the first inductor by 180 degrees and (ii) the phase of the AC signal as received by the second transistor is out of phase with respect to the AC signal as received by the second inductor by 180 degrees.

10. A method of operating a power amplifier to boost an AC signal, the method comprising:
receiving the AC signal at each of a first transistor and a second transistor;
receiving the AC signal via the first transistor at a first inductor;
receiving the AC signal via the second transistor at a second inductor;
using a first phase conditioner inductively coupled with an input of the first transistor, conditioning a phase of the AC signal such that the AC signal as received by the first transistor is out of phase with respect to the AC signal as received by the first inductor; and
using a second phase conditioner inductively coupled with an input of the second transistor, conditioning a phase of the AC signal such that the AC signal as received by the second transistor is out of phase with respect to the AC signal as received by the second inductor.

11. A method of operating a power amplifier to boost an AC signal, the method comprising:
receiving the AC signal at each of a first transistor and a second transistor;
receiving the AC signal via the first transistor at a first inductor;
receiving the AC signal via the second transistor at a second inductor;
conditioning a phase of the AC signal such that the AC signal as received by the first transistor is out of phase with respect to the AC signal as received by the first inductor;
conditioning a phase of the AC signal such that the AC signal as received by the second transistor is out of phase with respect to the AC signal as received by the second inductor;
tuning a resonant frequency of the first inductor using a first capacitor; and
tuning a resonant frequency of the second inductor using a second capacitor.

12. The method of claim 10, further comprising:
to condition the phase of the AC signal such that the AC signal as received by the first transistor is out of phase with respect to the AC signal as received by the first inductor, conditioning a phase of the AC signal as received by a third inductor connected to the first transistor; and
to condition the phase of the AC signal such that the AC signal as received by the second transistor is out of phase with respect to the AC signal as received by the second inductor, conditioning a phase of the AC signal as received by a fourth inductor connected to the second transistor.

13. The method of claim 12, further comprising:
biasing the first transistor according to a first reference voltage; and
biasing the second transistor according to a second reference voltage.

14. The method of claim 12, further comprising:
providing an input signal to the first transistor; and
providing the input signal to the second transistor,
wherein the input signal corresponds to an output of a previous amplifier stage.

15. The method of claim 12, wherein (i) the AC signal as received by the first inductor is in phase with the AC signal as received by the third inductor and (ii) the AC signal as received by the second inductor is in phase with the AC signal as received by the fourth inductor.

16. The method of claim 10, wherein (i) the AC signal as received by the first transistor is out of phase with respect to the AC signal as received by the first inductor by 180 degrees and (ii) the phase of the AC signal as received by the second transistor is out of phase with respect to the AC signal as received by the second inductor by 180 degrees.

* * * * *